(12) United States Patent
Kawazu et al.

(10) Patent No.: US 6,737,288 B2
(45) Date of Patent: May 18, 2004

(54) METHOD FOR FABRICATING A SEMICONDUCTOR DEVICE

(75) Inventors: Zempei Kawazu, Tokyo (JP); Tetsuya Yagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 128 days.

(21) Appl. No.: 10/059,415

(22) Filed: Jan. 31, 2002

(65) Prior Publication Data

US 2002/0175343 A1 Nov. 28, 2002

(30) Foreign Application Priority Data

May 24, 2001 (JP) ......................... 2001-155138

(51) Int. Cl.$^7$ ..................... H01L 21/00; H01L 21/302
(52) U.S. Cl. ..................... 438/24; 438/22; 438/42; 438/46; 438/47; 438/707; 438/708; 438/718; 438/796
(58) Field of Search ..................... 438/22, 24, 42, 438/43, 44, 46, 47, 707, 708, 718, 796.7

(56) References Cited

U.S. PATENT DOCUMENTS 5,081,002 A * 1/1992 Ruberto et al. ............. 430/297
5,419,808 A * 5/1995 Kitano ..................... 156/656.1

FOREIGN PATENT DOCUMENTS

| JP | 61-77384 | 4/1986 |
| JP | 62-176183 | 8/1987 |
| JP | 1-99276 | 4/1989 |

OTHER PUBLICATIONS

Ruberto et al., "Effect Of Carrier Confinement On The Laser–Induced Etching Of GaAs/ALGaAs Heterostructures", Applied Physics Letters, vol. 55, No. 10, Sep. 1989, pp. 984–986.
Sato, Electrode Chemistry Japan Technical Information Service, Chapter 2, 1993, pp. 70–99.

* cited by examiner

*Primary Examiner*—Donghee Kang
(74) *Attorney, Agent, or Firm*—Leydig, Voit & Mayer, Ltd.

(57) ABSTRACT

A heterojunction structure has an $Al_xGa_{1-x}As$ layer ($0<x\leq1$), on which an $Al_yGa_{1-y}As$ layer ($0\leq y\leq1$ and $y<x$) is provided and having a band gap energy smaller than that of the $Al_xGa_{1-x}As$ layer and a valence band energy edge higher than that of the $Al_xGa_{1-x}As$ layer. When the $Al_yGa_{1-y}As$ layer is selectively etched, an Au electrode film is formed on a surface of the $Al_yGa_{1-y}As$ layer outside an etching region, a resist pattern is formed covering the Au electrode film and leaving exposed the etching region, and the $Al_yGa_{1-y}As$ layer is selectively removed by etching while irradiating with light, using an etching solution having a Fermi level higher than that of the $Al_yGa_{1-y}As$ layer.

7 Claims, 8 Drawing Sheets

METHOD FOR FABRICATING A SEMICONDUCTOR DEVICE

BACKGROUND OF THE INVENTION

1. Field of the Invention

This invention relates to a method for fabricating a semiconductor device and, more particularly, to an etching method used in the method for fabricating a semiconductor device.

2. Description of the Related Art

To constitute various types of semiconductor devices including, for example, laser diodes, GaAs-FET and HEMT, a hetero junction structure has been used to improve the characteristics of the semiconductor device. In order to arrange a good-quality hetero junction structure, the lattice constants of both materials should be substantially coincident with each other.

In the field of semiconductor lasers, for example, there has been proposed the reduction of a threshold current by use of a so-called heterojunction structure wherein an emission region having a small band gap energy be sandwiched between semiconductor layers having a large band gap energy. Since then, it has been known to prepare a heterojunction structure of good quality using GaAs and $Al_xGa_{1-x}As$, thereby forming a GaAs-AlGaAs double heterojunction laser.

The $Al_xGa_{1-x}As$ material exhibits an increasing band gap energy Eg with an; increase in x, and, although the refractive index n decreases, the change in lattice constant is very small.

In the selective etching at the interface of growth of a hetero junction structure for the formation of a semiconductor device having the hetero junction structure, the etching is stopped only due to the difference in chemical etching rate between a layer to be etched and a layer for stopping the etching. Accordingly, it is necessary that the ratio in etching rate between the layer to be etched and the layer for stopping the etching be 50 or more.

This makes it difficult to stop the etching with high accuracy depending on the types of materials for the layer to be etched and the layer for stopping the etching in the course of selective etching, even though an $Al_xGa_{1-x}As$ material capable of forming a high-quality heterojunction is used. This entails much time for the choice of an etching solution and also an appreciable limitation placed on the choice of materials used to constitute a semiconductor device.

Figure 13:
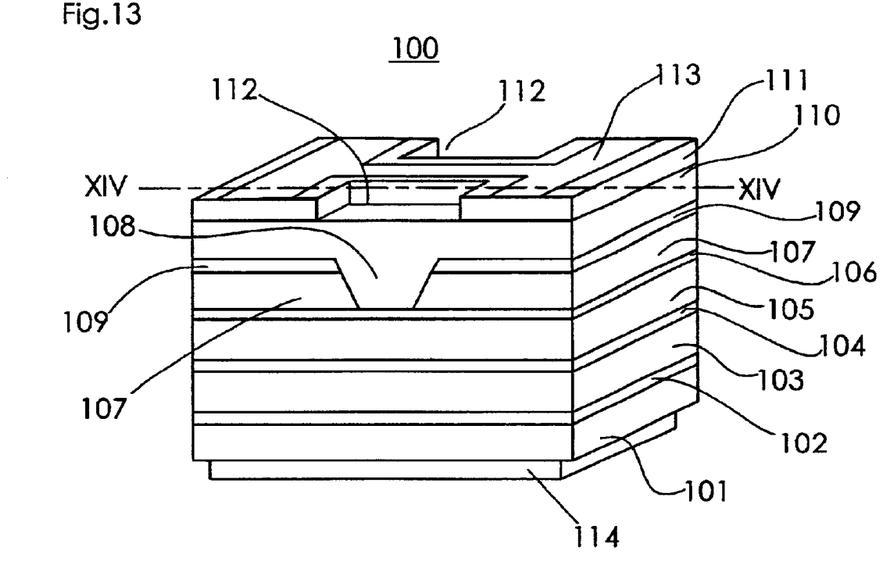
FIG. 13 is a perspective view of a conventional semiconductor laser.

FIG. 13 is a perspective view showing a conventional semiconductor laser. In FIG. 13, indicated by 100 is a semiconductor laser, by 101 is an n-type GaAs substrate (n-type is hereinafter referred to as "n-", and likewise, p-type is referred to as "p-"), by 102 is a buffer layer made of n-GaAs, by 103 is an n-type clad layer made of n-$Al_{0.5}Ga_{0.5}As$, by 104 is a multiple quantum well active layer made of $Al_{0.35}Ga_{0.65}As/Al_{0.15}Ga_{0.85}As$, by 105 is a first p-type clad layer made of p-$Al_{0.5}Ga_{0.5}As$, by 106 is an etching stopper layer made of p-$Al_{0.2}Ga_{0.8}As$, by 107 is a current block layer made of $Al_{0.6}Ga_{0.4}As$, by 108 is an opening of the current block layer 107, by 109 is a surface protective layer made of n-GaAs, by 110 is a second p-type clad layer made of p-$Al_{0.5}Ga_{0.5}As$, by 111 is a contact layer made of p-GaAs, by 112 is a removed region of the contact layer 111, by 113 is a p electrode, and by 114 is an n electrode.

Next, a method of fabricating a conventional semiconductor laser is described.

Figure 14:
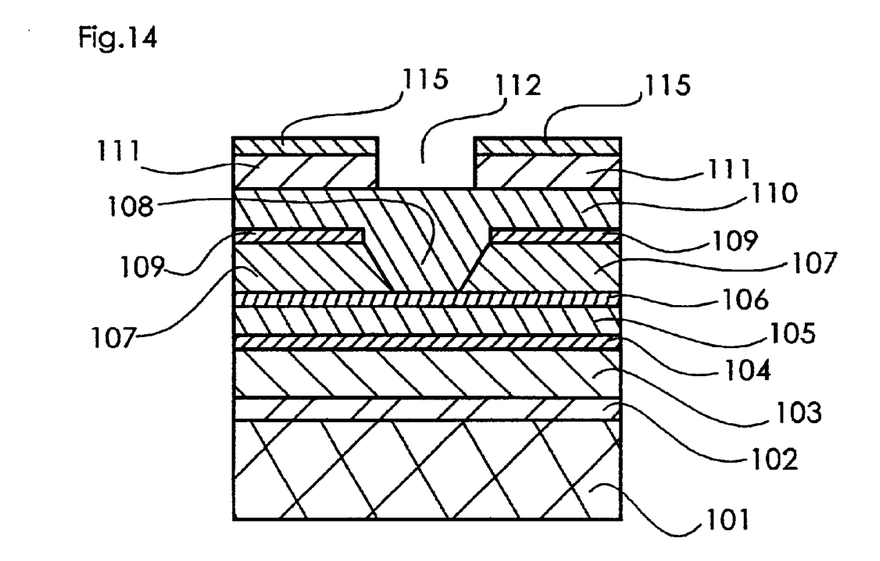
FIG. 14 is a sectional view of a semiconductor laser at one stage in a conventional method for fabricating a semiconductor laser.
Figure 15:
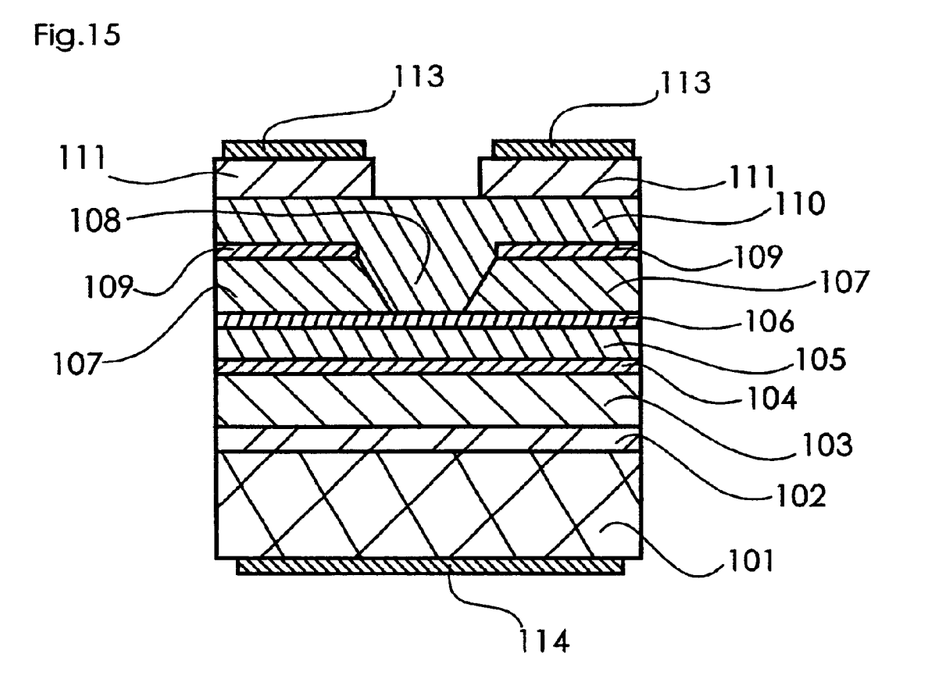
FIG. 15 is a sectional view of a semiconductor laser at another stage in the conventional method for fabricating a semiconductor laser.

FIGS. 14 and 15 are, respectively, a sectional view showing a semiconductor laser at one stage in a conventional method of fabricating a semiconductor laser. FIGS. 14 and 15 are, respectively, a sectional view taken along line XIV—XIV of FIG. 13.

Referring to FIG. 14, after successive deposition, on the n-GaAs substrate via the buffer layer 102, of the n-type clad layer 103, the multiple quantum well active layer 104, the first p-type clad layer 105, the etching stopper layer 106, the current block layer 107 and the surface protective layer 109, a resist film is formed on the surface of the surface protective layer 109 to form a resist pattern having a band-shaped opening along a direction of an optical waveguide. The surface protective layer 109 is subjected to patterning by use of a photolithographic technique using the resist pattern as a mask. Subsequently, after removal of the mask pattern of the resist film, the current block layer 107 is selectively etched through the mask of the patterned surface protective layer 109 until the etching stopper layer 106 is exposed, thereby forming a band-shaped opening 108 in the current block layer 107.

Thereafter, the second p-type clad layer 110 and the contact layer 111 are successively built up on the current block layer 107 including the opening 108 and the surface protective layer 109.

A resist film is formed on the surface of the contact layer 111, and a resist pattern 115 having an opening is formed in the vicinity of opposite end faces of the band-shaped opening 108, followed by selective etching of the contact layer 111 through the resist pattern 115 used as a mask to form the removed region 112 of the contact layer 111. The results provided by the selective etching step are shown in FIG. 14.

For selective etching and removing the contact layer 111, a mixture of ammonia and hydrogen peroxide is used as an etching solution.

With reference to FIG. 15, the resist patter 115 is removed and the p electrode 113 is formed, and the n-GaAs substrate 101 is polished at a back side thereof to a given thickness, followed by formation of the n electrode 114. The results of these steps are shown in FIG. 15.

The etching solution (a mixed solution of ammonia and an aqueous hydrogen peroxide solution) used in the selective etching for removal of the contact layer 111 carried out in the conventional fabrication method serves to stop the etching by using only the difference in chemical etching rate between GaAs used for the contact layer 111 and $Al_{0.5}Ga_{0.5}As$ used for the second p-type clad layer 110. Accordingly, it is necessary that the ratio of the etching rate between the GaAs of the layer to be etched and the $Al_xGa_{1-x}As$ of the etching stop layer be 50 or over. To this end, it is necessary that the compositional ratio of Al in the etching stop layer be at 0.2 or over.

In this case, the etching stop layer is constituted of the second p-type clad layer 110, so that the compositional ratio of Al can be set at 0.5, thereby ensuring a satisfactory etching rate ratio to GaAs. In general, however, such conditions are not always ensured, and thus, the selective etching of a compound semiconductor subjected to hetero junction has suffered a substantial limitation depending on the type of heterojunctioned material, which has, in turn, placed considerable limitations on the selection and structure of constituting materials of a semiconductor device.

Though a satisfactory etching rate ratio has been ensured, the control of carrying out etching to a necessary and sufficient extent is quite difficult, under which overetching leads to side etching. If a mixed solution of ammonia and an aqueous hydrogen peroxide solution is provided as an etching solution, surface oxidation takes place violently, thus being undesirable from the standpoint of surface morphology.

It will be noted that known techniques are described in Japanese Patent Laid-Open Nos. Hei 01-099276, Sho 61-077384 and Sho 62-176183, which disclose techniques of improving the accuracy of selective etching.

In Japanese Patent Laid-Open No. Hei 01-099276, there is disclosed a method using tartaric acid as an etching solution.

Moreover, in Appl. Phys. Lett. 55(10), Sep. 4, 1989, p. 984–p. 986, photochemical etching is described wherein a laser beam from a GaAs/AlGaAs hetero structure is irradiated.

SUMMARY OF THE INVENTION

The present invention has been made to overcome the above-described drawbacks and disadvantages of the related art. It is an object of the present invention to provide a method for fabricating a semiconductor device comprising the step of accurately stopping selective etching at the interface of a hetero junction arrangement.

According to one aspect of the invention, there is provided a method for fabricating a semiconductor device as follows. The method comprises the steps of; providing a hetero junction structure wherein a first semiconductor layer is formed thereon with a second semiconductor layer that has a band gap smaller than that of the first semiconductor layer and a valence band energy larger than that of the first semiconductor layer and forming a metal film on a surface of the second semiconductor layer and outside a first portion where the second semiconductor layer is to be removed; and forming a mask pattern covering the metal film and permitting the first portion of the second semiconductor layer to be exposed and selectively removing the second semiconductor layer under irradiation of light through the mask pattern as a mask by use of an etching solution having a Fermi level higher than that of the second semiconductor layer.

Accordingly, holes contributing to etching are generated by irradiation of light and the second semiconductor layer is rendered thinner. Thus mobility of the holes in directions parallel to the thin film of the second semiconductor layer increases and the holes are likely to move toward the metal film via the second semiconductor, thereby reducing the number of holes contributing to the etching and stopping the etching of the second semiconductor layer. The etching can be stopped to a necessary and sufficient extent at the interface of the hetero junction, thereby permitting selective etching. Thus, the stop of the etching can be very accurately controlled. Eventually, this leads to mitigation of limitations on the type of material and structure of a semiconductor device and also to inexpensive fabrication of semiconductor devices having uniform characteristics by a simple procedure.

Another object of the invention is to provide a method for fabricating the AlGaAs laser having the contact layer-removed structure by a simple procedure.

According to another aspect of the invention, there is provided a method for fabricating a semiconductor device. The method comprises the steps of: successively forming, on a GaAs substrate of a first conduction type, a lower clad layer made of an AlGaAs material of a first conduction type, an active layer made of an AlGaAs material and having a multiple quantum well structure, a first upper clad layer made of an AlGaAs material of a second conduction type, and a current block layer made of an AlGaAs material of a first conduction type and forming a groove for a current path in the current block layer made of the AlGaAs material along a direction of a light guide; forming a second upper clad layer made of an $Al_xGa_{1-x}As$ ($0<x\leq1$) on the current block layer so as to bury the groove, and forming thereon a contact layer made of an $Al_yGa_{1-y}As$ ($0\leq y\leq1$ and $y<x$) of a second conduction type; forming a metal electrode film on the contact layer and forming a resist pattern so as to cover the metal electrode film therewith and expose a surface of the contact layer at opposite ends of the groove for the current path; and selectively etching the contact layer with an etching solution, which has a Fermi level higher than that of the contact layer and contains tartaric acid, by use of the resist pattern as a mask under irradiation of light.

Accordingly, the selective etching of the contact layer of the AlGaAs laser having a contact layer-removed structure can be performed by a simple process. This eventually leads to the mitigation of limiting conditions of the type of a material and structure constituting the AlGaAs laser having the contact layer-removed structure and also to the inexpensive fabrication of AlGaAs lasers, which have uniform characteristics, good surface morphology and the contact layer-removed structure, by a simple procedure.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION TO THE PREFERRED EMBODIMENTS

FIGS. 1A and 1B, and FIGS. 2A and 2B are, respectively, schematic views illustrating a method of fabricating a semiconductor device according to one embodiment of the invention.

Figure 1A:
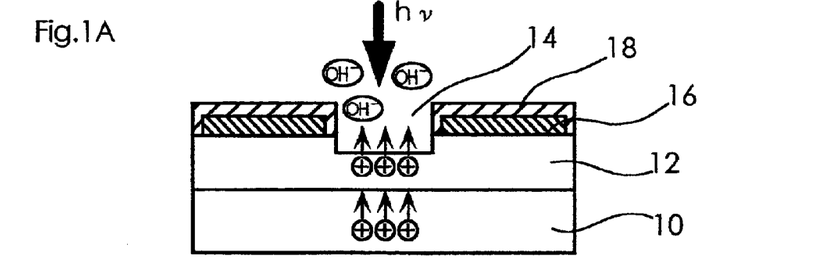
FIGS. 1A and 1B are schematic views illustrating a method for fabricating a semiconductor device according to an embodiment of the invention.
Figure 1B:
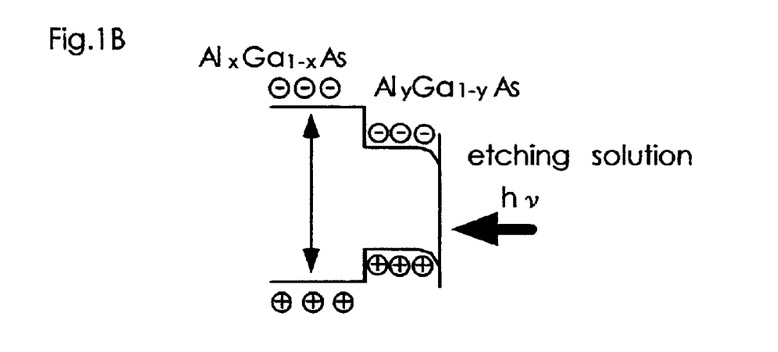

FIG. 1A is a schematic view showing the movement of holes in the course of etching, and FIG. 1B is a schematic view showing an energy band in the course of etching.

Figure 2A:
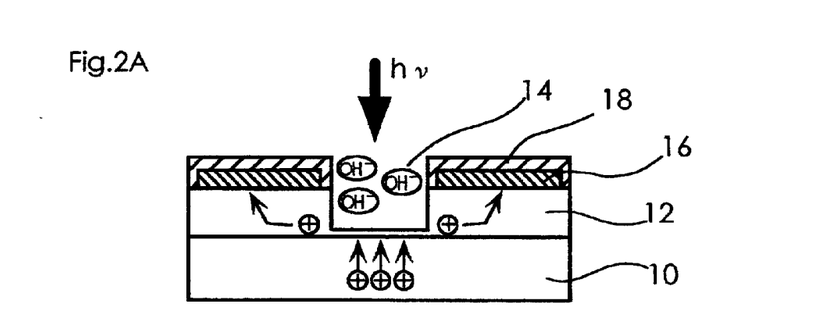
FIGS. 2A and 2B are schematic views illustrating a method for fabricating a semiconductor device according to the embodiment of the invention.
Figure 2B:
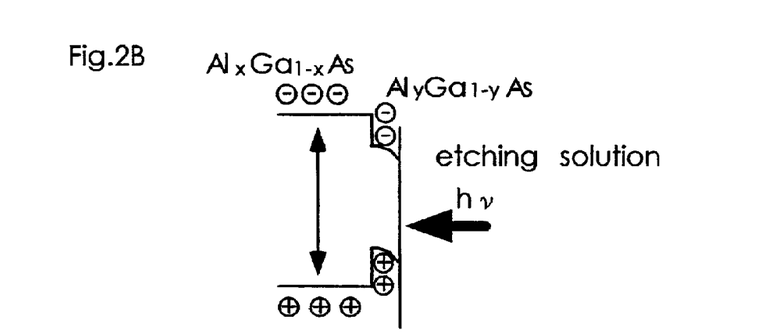

FIG. 2A is a schematic view showing the movement of holes under conditions where etching is stopped, and FIG. 2B is a schematic view showing an energy band under conditions where etching is stopped.

In FIGS. 1A and 2A, reference numeral 10 indicates, for example, an $Al_xGa_{1-x}As$ layer (where $0<x\leq1$) as a first semiconductor layer, and reference numeral 12 indicates, for example, an $Al_yGa_{1-y}As$ layer (where $0\leq y\leq1$ and $y<x$).

Reference numeral 14 indicates an etching region where the an $Al_yGa_{1-y}As$ layer 12 is to be etched as a first portion, and reference numeral 16 indicates, for example, an Au electrode film as a metal film. This Au electrode film 16 is formed at a distance of about several $\mu$m to 10 $\mu$m from the etching region 14 to surround the etching region 14 at an outer side thereof.

Reference numeral 18 indicates a resist pattern provided as a mask pattern, which is so formed as to cover the Au electrode film 16 therewith and to expose the etching region 14.

The magnitudes of the energies of the band gap and the valance band of the $Al_xGa_{1-x}As$ layer 10 and the $Al_yGa_{1-y}As$ layer 12 are such that as will be seen from the Al compositional ratio set as $y<x$ and also from the energy bands shown in FIGS. 1B and 2B, the band gap of the $Al_xGa_{1-x}As$ layer 10 is larger than that of the $Al_yGa_{1-y}As$ layer 12, and the energy of the valence band of the $Al_yGa_{1-y}As$ layer 12 is larger than that of the $Al_xGa_{1-x}As$ layer 10.

When an etching solution is adjusted so that the Fermi level thereof is higher than that of the $Al_yGa_{1-y}As$ layer 12, the shapes of the conduction band and the valence band of the $Al_yGa_{1-y}As$ layer 12 in contact with the etching solution can be slightly curved as shown in the energy bands of in FIG. 1B and FIG. 2B.

The Fermi level of this etching solution is the electrochemical potential of the redox electrons in the etching solution, as described in, for example, a book entitled "Electrode Chemistry" authored by Norio Sato and published by Japan Technical Information Service in 1993 (Chapter 2, pages 70 through 99).

The electrochemical potential of a redox electron "$\bar{\mu}(/)e$ (REDOX)", or the Fermi level of the redox electron "$\epsilon F$ (REDOX)" is generally expressed by the following formula. It should be noted that the expression "$\mu$ (/)" denotes $\mu$ with an upper bar.

$$\bar{\mu}(/)e(REDOX) = \epsilon F(REDOX) = \{(\epsilon OX, A + \epsilon RED, D)/2\} + \{(\lambda OX - \lambda RED)/2\}$$

where:

$\epsilon OX,A$ is the acceptor level of the oxidant, or the electron affinity of the oxidant; $\epsilon RED,D$ is the donor level of the reductant, or the ionization energy of the reductant; and $\lambda OX$ and $\lambda RED$ are the hydration structure rearrangement energy of the oxidant and the reductant, respectively.

Selective etching is now described.

FIGS. 1A and 1B show the state where etching is in progress, under which when light having a sufficient energy hv is irradiated, electron and hole pairs are formed at the etching region 14, exposed through the resist pattern 18 used a mask, of the $Al_xGa_{1-x}As$ layer 10 and the $Al_yGa_{1-y}As$ layer 12. The electron and holes formed in the $Al_xGa_{1-x}As$ layer 10 move toward the $Al_yGa_{1-y}As$ layer 12, and especially, the holes are stored up in the $Al_yGa_{1-y}As$ layer 12. At a portion which contacts the etching solution through the resist pattern 18 as a mask, the holes are combined with the OH group (OH$^-$) of the etching solution, thereby permitting the $Al_yGa_{1-y}As$ layer 12 to be dissolved and etched.

FIGS. 2A and 2B show the state where etching is further in progress and the $Al_yGa_{1-y}As$ layer 12 is made thinner.

As the $Al_yGa_{1-y}As$ layer 12 at the etched region 14 is made thinner, the holes stored up in the $Al_yGa_{1-y}As$ layer 12 are converted to a two-dimensional hole gas, thereby increasing the mobility of the thinner $Al_yGa_{1-y}As$ layer 12 in parallel directions. Accordingly, immediately after the holes formed in the $Al_xGa_{1-x}As$ layer 10 arrive at the $Al_yGa_{1-y}As$ layer 12, the holes move in directions parallel to the $Al_yGa_{1-y}As$ layer 12, and are moved toward the Au electrode film 16 via the masked $Al_yGa_{1-y}As$ layer 12 and disappear through the Au electrode film 16. As a result, the number of holes to be combined with the hydroxyl groups of the etching solution is reduced, so that the dissolution of the $Al_yGa_{1-y}As$ layer 12 is stopped, thereby stopping the etching.

In order to chemically stop the etching in the course of selective etching, it has been necessary that the etch rate ratio be at 50 or over. When etching is effected photochemically under satisfactory light irradiation so that the semiconductor layer to be etched is rendered thin sufficient to permit the holes stored up in the semiconductor layer to be converted to the two-dimensional hole gas, the mobility of the holes along directions parallel to the thin film is increased. In this condition, the holes are moved to a metal film formed on the surface of the semiconductor layer to be etched, and thus, do not contribute to the etching, under which even though the etch rate ratio is chemically small, the etching can be stopped at an etching stop layer thereby enabling selective etching to be performed. In this way, etching stop can be very accurately controlled.

This eventually leads not only to mitigation of limiting conditions on the type of constituting material and structure of a semiconductor device, but also the inexpensive fabrication of semiconductor devices of uniform characteristics by a simple procedure.

EXAMPLE 1

A catastrophic optical damage (hereinafter referred to as COD) is known as a degradation phenomenon of a semiconductor laser. This COD degradation is ascribed to the rise of a temperature at a laser end face to an extent of crystal breakage through the interaction of the generation of heat at the end face of the laser and the light absorption caused by the generation of heat.

To prevent the COD degradation, the suppression of generation of Joule heat has been proposed by not passing an electric current to the active layer in the vicinity of the end face of the laser, and a semiconductor laser that has a contact layer-removed structure wherein part of the contact layer in the vicinity of the laser end face has been removed is now put into practice.

Figure 3:
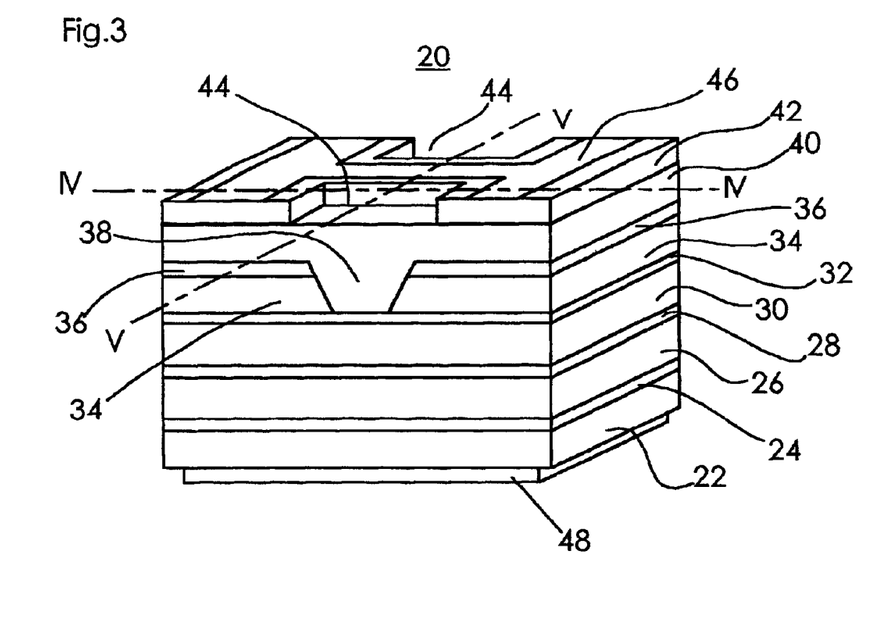
FIG. 3 is a perspective view of a semiconductor laser according to an example embodying a method for fabricating a semiconductor device of the invention.
Figure 4:
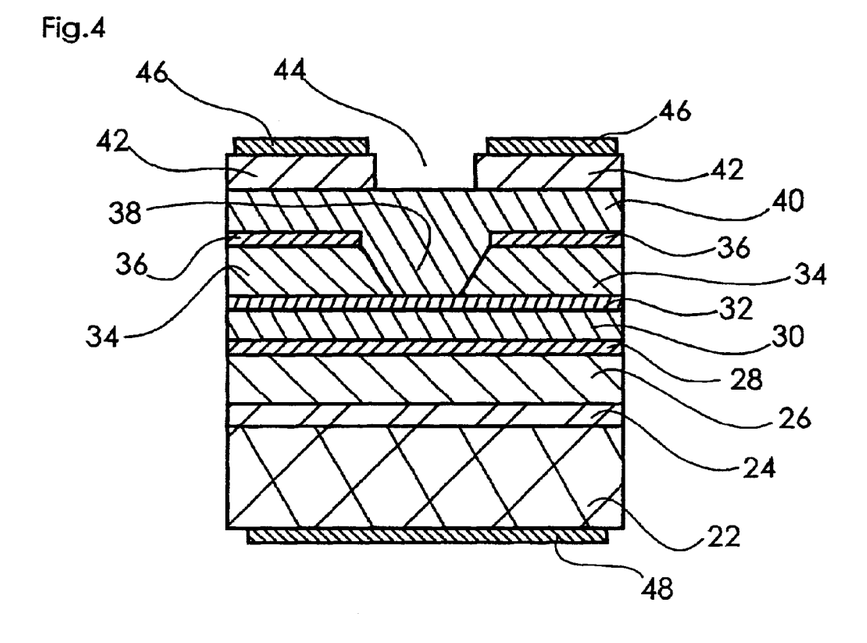
FIG. 4 is a sectional view of the semiconductor laser of the invention, taken along line IV—IV of FIG. 3.

FIG. 3 is a perspective view of a semiconductor laser according to an example of a method of fabricating a semiconductor laser of the invention. FIG. 4 is a sectional view of a semiconductor laser, taken along line IV—IV of FIG. 3, and FIG. 5 is a sectional view of a semiconductor laser taken along the line V—V of FIG. 3.

Figure 5:
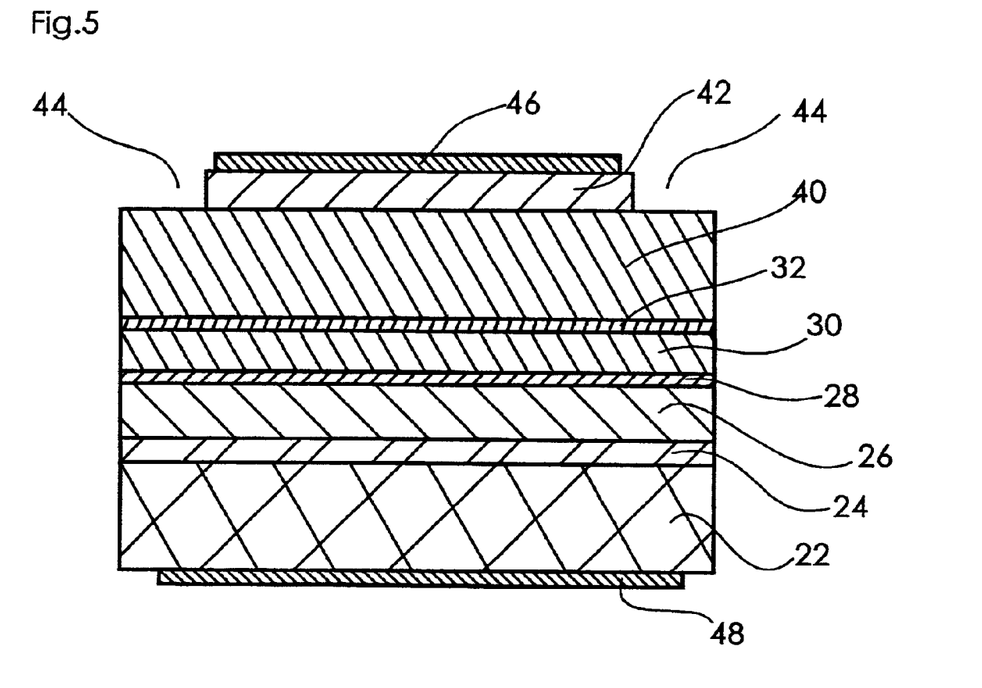
FIG. 5 is a sectional view of the semiconductor laser of the invention, taken along line V—V of FIG. 3.

In FIGS. 3, 4 and 5, indicated by 20 is a semiconductor laser having a contact layer-removed structure, by 22 is an n-GaAs substrate, by 24 is a buffer layer provided on the n-GaAs substrate 22 and made of n-GaAs, by 26 is an n-type clad layer provided on the buffer layer 24 and made of n-$Al_{0.5}Ga_{0.5}As$, and by 28 is an active layer having a multiple quantum well structure provided on the n-type clad layer 26. A light guide layer and a barrier layer are, respectively, formed of $Al_{0.35}Ga_{0.65}As$, and a well layer is formed of $Al_{0.15}Ga_{0.85}As$.

Indicated by 30 is a first p-type clad layer provided on the active layer 28 and made of p-$Al_{0.5}Ga_{0.5}As$, and by 32 is an etching stopper layer provided on the first p-type clad layer and made of p-$Al_{0.2}Ga_{0.8}As$.

Indicated by 34 is a current block layer provided on the etching stopper layer 32 and made of n-$Al_{0.6}Ga_{0.4}As$, and by 36 is a surface protective layer provided on the current block layer 34 and made of n-GaAs, with an opening 38 extending along a light guide direction at the centers of the current block layer 34 and the surface protective layer 36. This opening 38 serves as a current path, through which an electric current passes to the active layer 28.

Indicated by 40 is a second p-type clad layer buried in the opening 38, provided on the surface protective layer 36 and made of p-$Al_xGa_{1-x}As$, where x, in this example, equals 0.5. Indicated by 42 is a contact layer provided on the second p-type clad layer 40 and made of p-$Al_yGa_{1-y}As$ (0<y<1 and y<x) where, in this example, y=0. The contact layer 42 is provided with a removal region 44 corresponding to the opening 38 from which the contact layer 42 in the vicinity of the laser end face has been removed so that no electric current passes to the vicinity of the laser end face of the active layer 28.

Indicated by 46 is a p electrode constituted of an Au-containing metal layer, which is so arranged that at least a part thereof corresponding to a peripheral edge of the removal region 44 surrounds the outer side of the removal region 44 at a distance of several $\mu$m to about 10 $\mu$m from the removal region 44. Indicated by 48 is an n electrode provided on the back surface of the n-GaAs substrate 22.

In the semiconductor laser 20 of this arrangement, a bias potential is applied between the p electrode 46 and the n electrode 48, thereby permitting laser oscillation. Because any current does not pass to the active layer 28 in the vicinity of the laser end face corresponding to the removal region 44 of the contact layer 42, the generation of the Joule heat is suppressed in the vicinity of the laser end face of the active layer 28, so that the COD degradation at the laser end face is prevented.

The method for fabricating the semiconductor laser is now described.

FIGS. 6, 7, 8, 9, 10, 11 and 12 are, respectively, sectional views of a semiconductor laser at individual stages of a method for fabricating a semiconductor laser according to the invention.

Figure 6:
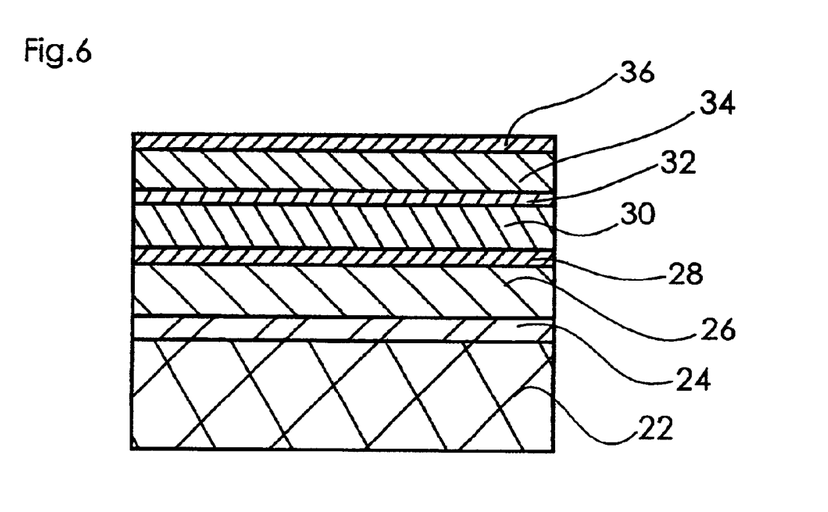
FIG. 6 is a sectional view of a semiconductor laser at a step of a method for fabricating a semiconductor laser according to an embodiment of the invention.

Referring now to FIG. 6, there are successively formed, on the n-GaAs substrate 22 by a crystal growth method such as an MOCVD method, of an n-GaAs layer as the buffer layer 24, an n-$Al_{0.5}Ga_{0.5}As$ layer as the n-type clad layer 26, an $Al_{0.35}Ga_{0.65}As/Al_{0.15}Ga_{0.85}As$ multiple quantum well layer as the active layer 28, a p-$Al_{0.5}Ga_{0.5}As$ layer as the first p-type clad layer 30, a p-$Al_{0.2}Ga_{0.8}As$ layer as the etching stopper layer 32, an n-$Al_{0.6}Ga_{0.4}As$ layer as the current block layer 34, and an n-GaAs layer as the surface protective layer 36. The results are shown in FIG. 6.

Figure 7:
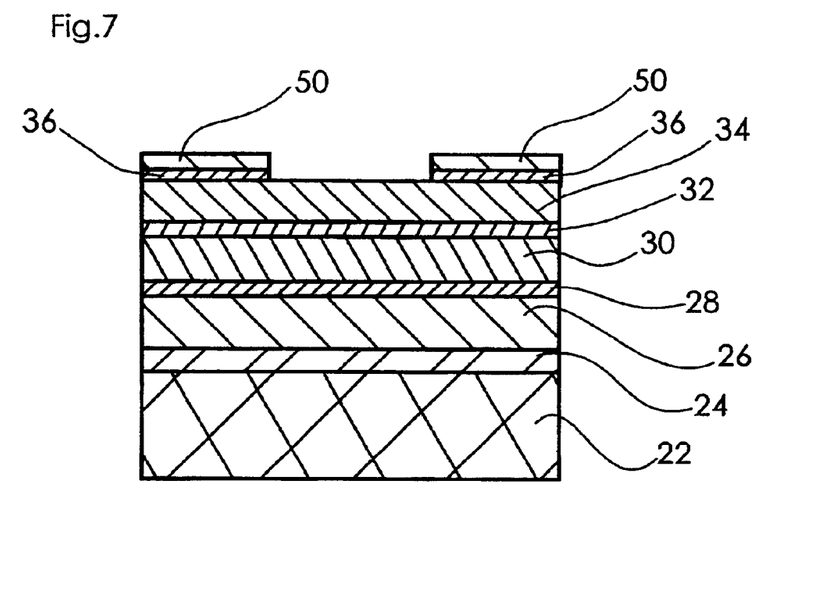
FIG. 7 is a sectional view of the semiconductor laser at another step of the method for fabricating a semiconductor laser according to the embodiment of the invention.

With reference to FIG. 7, a resist film is subsequently formed on the surface of the surface protective layer 36 and a resist pattern 50 having a band-shaped opening extending along the light guide direction is formed.

The n-GaAs layer used as the surface protective layer 36 is subjected to patterning according to a photolithographic technique using the resist pattern 50 as a mask, thereby forming an opening in the n-GaAs layer serving as the surface protective layer 36. The results are shown in FIG. 7.

Figure 8:
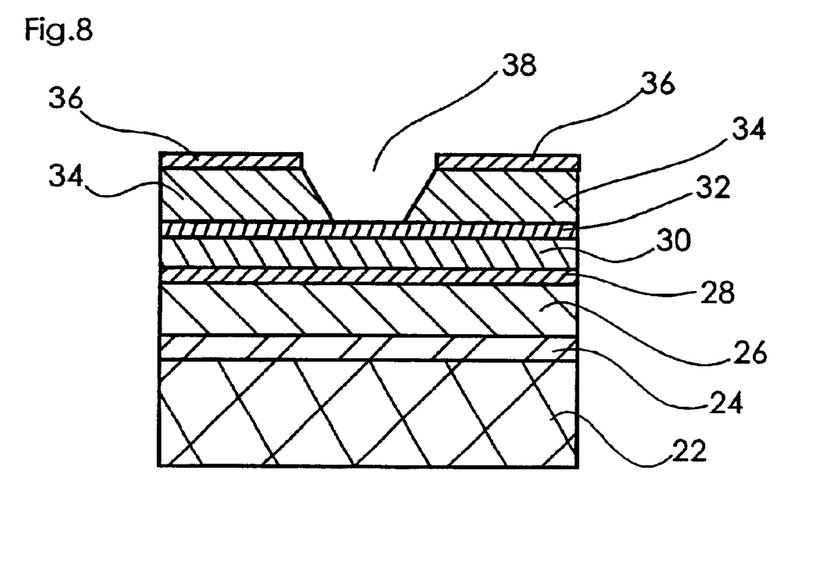
FIG. 8 is a sectional view of the semiconductor laser at a further step of the method for fabricating a semiconductor laser according to the embodiment of the invention.

Referring to FIG. 8, after removal of the resist pattern 50, the n-$Al_{0.6}Ga_{0.4}As$ layer serving as the current block layer 34 is etched through the mask of the n-GaAs layer serving as the surface protective layer 36 formed with the opening therein until the p-$Al_{0.2}Ga_{0.8}As$ layer serving as the etching stopper layer 32 is exposed, thereby forming the opening 38. The results are shown in FIG. 8.

Figure 9:
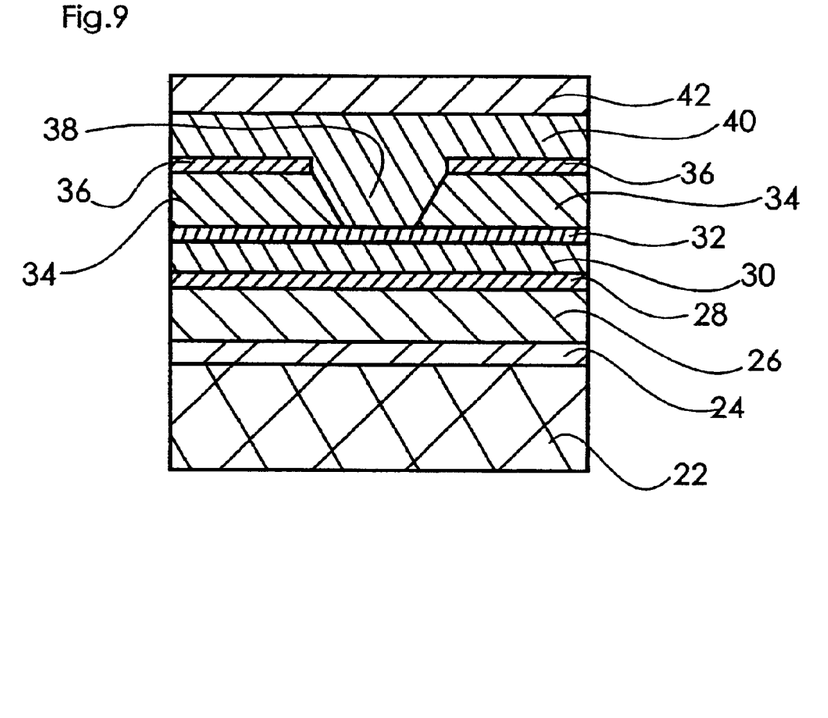
FIG. 9 is a sectional view of the semiconductor laser at a still further step of the method for fabricating a semiconductor laser according to the embodiment of the invention.

With reference to FIG. 9, a p-$Al_{0.5}Ga_{0.5}As$ layer serving as the second p-type clad layer 40 and the p-GaAs layer serving as the contact layer 42 are, successively, formed according to a crystal growth method on the n-$Al_{0.6}Ga_{0.4}As$ layer serving as the current block layer 34 including the opening 38 and also on the n-GaAs layer serving as the surface protective layer 36. FIG. 9 shows the results.

Figure 10:
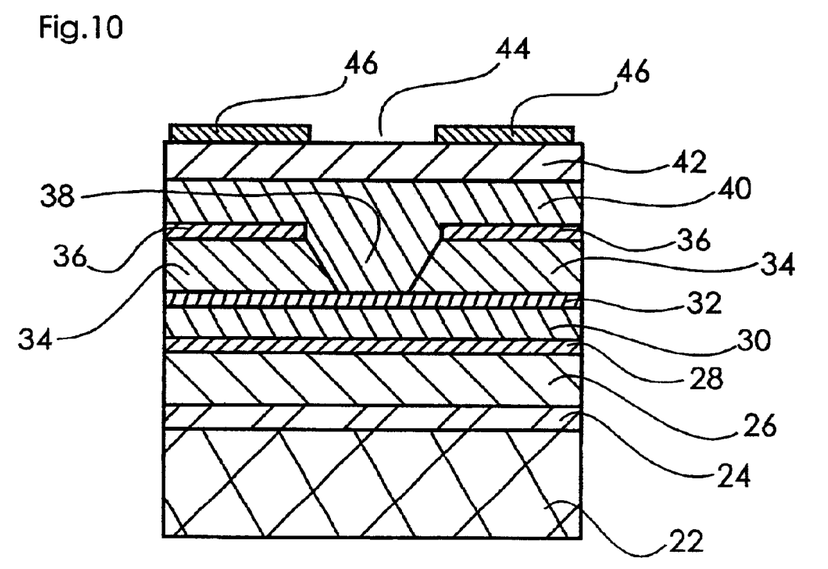
FIG. 10 is a sectional view of the semiconductor laser at a yet further step of the method for fabricating a semiconductor laser according to the embodiment of the invention.

With reference to FIG. 10, the p electrode 46 is formed on the surface of the p-GaAs layer serving as the contact layer 42 such as by vacuum deposition. The p electrode 46 is formed outside the removed region 44 of the p-GaAs layer serving as the contact layer 42. FIG. 10 shows these results.

Figure 11:
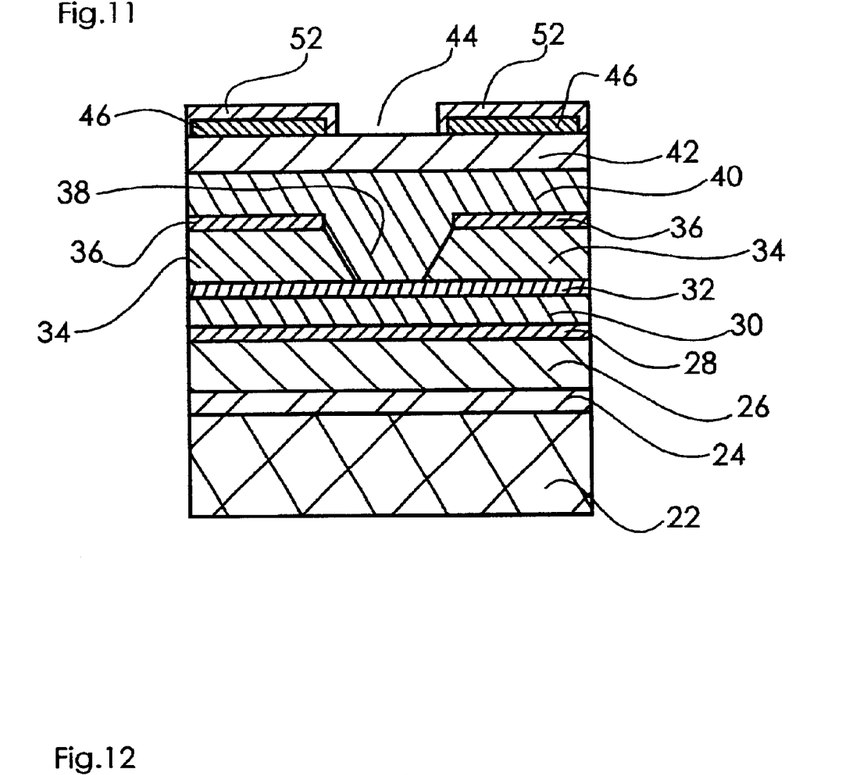
FIG. 11 is a sectional view of the semiconductor laser at another step of the method for fabricating a semiconductor laser according to the embodiment of the invention.

With reference of FIG. 11, a resist film is subsequently formed on the contact layer 42 with the p electrode 46 being covered therewith, followed by formation of a resist pattern 52 by use of a photolithographic technique so that the removal region 44 of the p-GaAs layer is exposed. Thereafter, this resist pattern 52 is used as a mask to effect etching under light irradiation by use of a mixed solution of tartaric acid and an aqueous hydrogen peroxide solution (with a ratio between tartaric acid and the aqueous hydrogen peroxide solution being at 4:1). As a consequence, the p-GaAs layer only at the removal region 44 is selectively etched.

When etching is effected under irradiation of light having a sufficient energy hv, electron and hole pairs are formed in the p-GaAs layer of the removed region 44 exposed through the mask of the resist pattern 52 and also in the p-$Al_{0.5}Ga_{0.5}As$ layer provided as the second p-type clad layer 40.

The electrons and holes formed in the p-$Al_{0.5}Ga_{0.5}As$ layer provided as the second p-type clad layer 40 move toward the removed region 44 of the p-GaAs layer used as the contact layer 42, and especially, the holes are stored up in the p-GaAs layer at the removal region 44 wherein the holes are combined with the hydroxyl groups (OH$^-$) of an etching solution at a portion that is in contact with the etching solution through the mask of the resist pattern 5. Eventually, the p-GaAs layer at the removal region 44 is dissolved so that the etching is allowed to proceed.

As the p-GaAs layer at the removal region 44 is rendered thinner as a result of the etching being in further progress, the holes stored in the p-GaAs layer are converted to a two-dimensional hole gas, thereby increasing the mobility along directions parallel to the thinned p-GaAs layer at the removal region 44.

Accordingly, upon arrival of the holes, which have been formed within the p-$Al_{0.5}Ga_{0.5}As$ layer used as the second p-type clad layer 40, at the p-GaAs layer at the removal region 44, the holes immediately move in directions parallel to the thinned p-GaAs layer at the removal region 44 and are moved to the p electrode 46 via the masked p-GaAs layer, followed by extinction via the p electrode 46. As a result, the holes that are to be combined with the hydroxyl group in the etching solution are reduced in number, so that the dissolution of the p-GaAs layer at the removal region 44 is stopped, thereby stopping the etching.

At the time, a very thin p-GaAs layer is left, and this layer can be so thin as to be completely removed in a subsequent pretreatment, not causing any influence functionally as a semiconductor device. Accordingly, the etching can be stopped substantially to a necessary and sufficient extent.

In this connection, in case where a mixed solution of tartaric acid and an aqueous hydrogen peroxide solution is used in place of the mixed solution of ammonia and an aqueous in a conventional etching method, the etching rates of GaAs and $Al_{0.5}Ga_{0.5}As$ layer are substantially equal to each other, under which the etching is not stopped at the interface between GaAs and $Al_{0.5}Ga_{0.5}As$ but the $Al_{0.5}Ga_{0.5}As$ layer is also etched.

Figure 12:
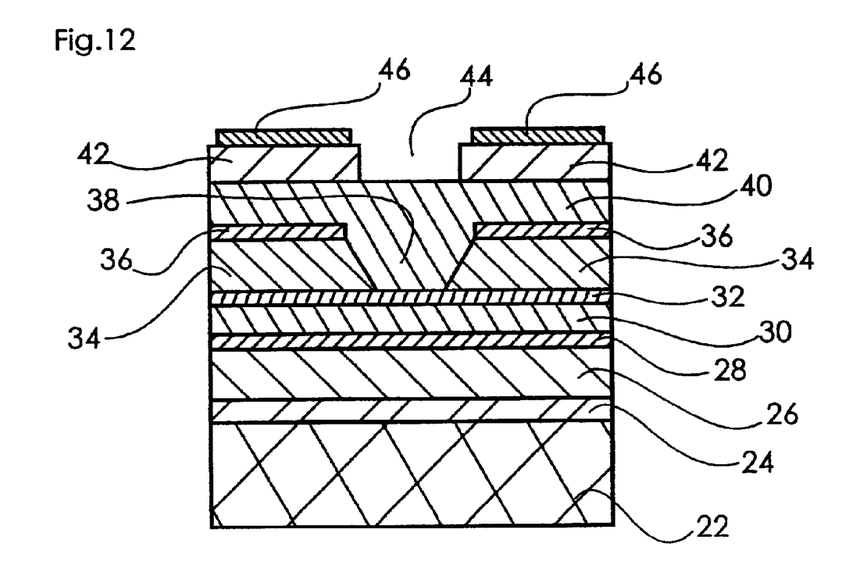
FIG. 12 is a sectional view of the semiconductor laser at yet another step of the method for fabricating a semiconductor laser according to the embodiment of the invention.

After completion of the etching, the resist pattern 52 is removed. FIG. 12 shows the results of this step.

Moreover, after the n-substrate 22 is polished at a back side thereof and shaped to a given thickness, the n electrode 48 is formed on the back side of the n-GaAs substrate 22, thereby completing the semiconductor laser 20 shown in FIGS. 3, 4 and 5.

This selective etching is not carried out by use of a chemical etching rate ratio alone, and the stop of the etching can be very accurately controlled. Thus, semiconductor lasers having uniform characteristics can be fabricated by a simple process and can be provided inexpensively along with an improved yield.

Since the etching solution used is made of the mixed solution of tartaric acid and an aqueous hydrogen peroxide solution, there can be fabricated a semiconductor laser having a reduced degree of surface oxidation and a good surface morphology.

Although an instance using an AlGaAs material has been described in this embodiment, similar results are obtained using other type of compound material including an InGaAs material, an AlGaInP material or an AlGaInAs material as well as other type of semiconductor materials having the interface of the hetero junction.

The method for fabricating a semiconductor device according to the invention contains such steps as illustrated hereinabove, with the following effects.

The method for fabricating a semiconductor device according to the invention contains the steps of; providing a hetero junction structure wherein a first semiconductor layer is formed thereon with a second semiconductor layer that has a band gap smaller than that of the first semiconductor layer and a valence band energy larger than that of the first semiconductor layer and forming a metal film on a surface of the second semiconductor layer and outside a first portion where the second semiconductor layer is to be removed; and forming a mask pattern covering the metal film and permitting the first portion of the second semiconductor layer to be exposed and selectively removing the second semiconductor layer under irradiation of light through the mask pattern as a mask by use of an etching solution having a Fermi level higher than that of the second semiconductor layer. Accordingly holes contributing to etching are generated by irradiation of light and the second semiconductor layer is rendered thinner. Thus mobility of the holes in directions parallel to the thin film of the second semiconductor layer increases and the holes are likely to move toward the metal film via the second semiconductor, thereby reducing the number of holes contributing to the etching and stopping the etching of the second semiconductor layer. The etching can be stopped to a necessary and sufficient extent at the interface of the hetero junction, thereby permitting selective etching. Thus, the stop of the etching can be very accurately controlled. Eventually, this leads to mitigation of limitations on the type of material and structure of a semiconductor device and also to inexpensive fabrication of semiconductor devices having uniform characteristics by a simple procedure.

Further, the first and second semiconductor layers are, respectively, formed of an AlGaAs material, an InGaAs material, an AlGaInP material or an AlGaInAs material. In the selective etching of a semiconductor device using the compound semiconductor layers, the etching of the second semiconductor layer can be accurately stopped. Thus, the conditions of limiting the type of material and the structure of a semiconductor device using an AlGaAs material, an InGaAs material, an AlGaInP material or an AlGaInAs material can be mitigated, and semiconductor deices having uniform characteristics can be fabricated inexpensively by a simple procedure.

Moreover, since an etching solution containing hydroxyl groups is used for etching, the etching can be effectively carried out through combination of holes in the second semiconductor layer with the hydroxyl groups. Eventually, semiconductor devices having uniform characteristics can be fabricated inexpensively by a simple procedure.

In addition, since the etching solution contains tartaric acid, the oxidation of the etched surface can be reduced in degree. Thus, a semiconductor device having a good surface morphology can be simply fabricated.

Also, the method for fabricating a semiconductor device according to the invention contains the steps of: successively forming, on a GaAs substrate of a first conduction type, a lower clad layer made of an AlGaAs material of a first conduction type, an active layer made of an AlGaAs material and having a multiple quantum well structure, a first upper clad layer made of an AlGaAs material of a second conduction type, and a current block layer made of an AlGaAs material of a first conduction type and forming a groove for a current path in the current block layer made of the AlGaAs material along a direction of a light guide; forming a second upper clad layer made of an $Al_xGa_{1-x}As$ ($0<x\leq1$) on the current block layer so as to bury the groove, and forming thereon a contact layer made of an $Al_yGa_{1-y}As$ ($0\leq y\leq 1$ and $y<x$) of a second conduction type; forming a metal electrode film on the contact layer and forming a resist pattern so as to cover the metal electrode film therewith and expose a surface of the contact layer at opposite ends of the groove for the current path; and selectively etching the contact layer with an etching solution, which has a Fermi level higher than that of the contact layer and contains tartaric acid, by use of the resist pattern as a mask under irradiation of light. Accordingly, the selective etching of the contact layer of the AlGaAs laser having a contact layer-removed structure can be performed by a simple process. This eventually leads to the mitigation of limiting conditions of the type of a material and structure constituting the AlGaAs laser having the contact layer-removed structure and also to the inexpensive fabrication of AlGaAs lasers, which have uniform characteristics, good surface morphology and the contact layer-removed structure, by a simple procedure.

While the presently preferred embodiments of the present invention have been shown and described. It is to be understood these disclosures are for the purpose of illustration and that various changes and modifications may be made without departing from the scope of the invention as set forth in the appended claims.

The entire disclosure of a Japanese Patent Application No. 2001-155138, filed on May 24, 2001 including specification, claims, drawings and summary, on which the Convention priority of the present application is based, are incorporated herein by reference in its entirety.

What is claimed is:

1. A method for fabricating a semiconductor device comprising:
    on a heterojunction structure including a first semiconductor layer, forming a second semiconductor layer that has a band gap energy smaller than the first semiconductor layer, and a higher valence band energy than that of the first semiconductor layer;
    forming a metal film on a surface of the second semiconductor layer and outside a first portion of the second semiconductor layer where the second semiconductor layer is to be removed;
    forming a mask pattern covering the metal film and exposing the first portion of the second semiconductor layer exposed, and
    selectively removing the second semiconductor layer by etching, while irradiating the second semiconductor layer with light, with a solution having a Fermi level higher than that of the second semiconductor layer, selective removal of the second semiconductor layer substantially stopping at the first semiconductor layer while irradiating the first and second semiconductor layers with light.

2. The method for fabricating a semiconductor device according to claim 1, wherein the first and second semiconductor layers are selected from the group consisting of AlGaAs, InGaAs, AlGaInP, AlGaInAs.

3. The method for fabricating a semiconductor device according to claim 2, wherein the etching solution contains hydroxyl groups.

4. The method for fabricating a semiconductor device according to claim 3, wherein the etching solution contains tartaric acid.

5. The method for fabricating a semiconductor device according to claim 1, wherein the etching solution contains hydroxyl groups.

6. The method for fabricating a semiconductor device according to claim 5, wherein the etching solution contains tartaric acid.

7. A method for fabricating a semiconductor device, the method comprising:
    successively forming, on a GaAs substrate having a first conductivity type, a lower cladding layer of AlGaAs having the first conductivity type, an active layer of AlGaAs and having a multiple quantum well structure, a first upper cladding layer of AlGaAs having a second conductivity type, and a current blocking layer of AlGaAs having the first conductivity type, and forming a groove for a current path in the current blocking layer, along a direction of a light guide;
    forming a second upper cladding layer of $Al_xGa_{1-x}As$ ($0<x\leq 1$) on the current blocking layer, filling the groove, and forming thereon a contact layer made of $Al_yGa_{1-y}As$ ($0\leq y\leq 1$ and $y<x$) having the second conductivity type;
    forming a metal electrode film on the contact layer;
    forming a resist pattern covering the metal electrode film and leaving exposed a surface of the contact layer at opposite ends of the groove for the current path; and
    selectively etching the contact layer with an etching solution which has a Fermi level higher than that of the contact layer and contains tartaric acid, using the resist pattern as a mask, while irradiating the contact layer with light.

* * * * *